United States Patent
Seita et al.

(10) Patent No.: US 6,881,319 B2
(45) Date of Patent: Apr. 19, 2005

(54) ELECTROLYTIC COPPER PLATING SOLUTION AND METHOD FOR CONTROLLING THE SAME

(75) Inventors: Masaru Seita, Saitama (JP); Hideki Tsuchida, Hasuda (JP); Shinjiro Hayashi, Saitama (JP)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/027,919

(22) Filed: Dec. 20, 2001

(65) Prior Publication Data

US 2003/0094376 A1 May 22, 2003

(30) Foreign Application Priority Data

Dec. 20, 2000 (JP) ........................................ 2000-387865

(51) Int. Cl.$^7$ .......................... C25D 3/38; C25D 21/18; C23C 16/00
(52) U.S. Cl. ........................ 205/296; 205/101; 205/291; 106/1.26
(58) Field of Search ................................ 205/291, 296, 205/297, 298, 101; 106/1.26; 428/457

(56) References Cited

U.S. PATENT DOCUMENTS

| | | | |
|---|---|---|---|
| 3,674,660 A | * 7/1972 | Lyde | 205/295 |
| 3,798,138 A | 3/1974 | Ostrow et al. | 204/52 R |
| 4,009,087 A | * 2/1977 | Kardos et al. | 204/52 R |
| 4,036,711 A | 7/1977 | Kardos et al. | 204/52 R |
| 4,134,803 A | 1/1979 | Eckles et al. | 204/52 R |
| 4,347,108 A | 8/1982 | Willis | 204/52 R |
| 4,384,930 A | * 5/1983 | Eckles | 205/253 |
| 4,469,564 A | * 9/1984 | Okinaka et al. | 205/125 |
| 5,151,170 A | 9/1992 | Montgomery et al. | 205/298 |
| 5,252,196 A | * 10/1993 | Sonnenberg et al. | 205/296 |
| 6,355,153 B1 | * 3/2002 | Uzoh et al. | 205/87 |
| 6,649,038 B1 | * 11/2003 | Mikkola et al. | 205/143 |
| 6,652,731 B1 | 11/2003 | Cobley et al. | 205/296 |
| 2002/0043468 A1 | * 4/2002 | Mikkola et al. | 205/157 |
| 2003/0015433 A1 | 1/2003 | Tsuchida et al. | 205/291 |
| 2003/0183526 A1 | 10/2003 | Kusaka et al. | 205/103 |
| 2004/0089557 A1 | 5/2004 | Tsuchida et al. | 205/291 |

FOREIGN PATENT DOCUMENTS

| | | | | |
|---|---|---|---|---|
| DE | 3240643 A1 | 5/1984 | | |
| GB | 2264717 A | * 9/1993 | ............ | C25D/3/38 |
| JP | 7-336017 | 12/1995 | | |

* cited by examiner

Primary Examiner—Edna Wong
(74) Attorney, Agent, or Firm—S. Matthew Cairns

(57) ABSTRACT

Disclosed are an electrolytic copper plating solution containing a specific sulfur-containing compound and a thiol-reactive compound, and an electrolytic copper plating process using such an electrolytic copper plating solution. The present invention can prevent the copper layer on the resulting composite material from forming aggregation and, when the plating is intended to fill vias, make it possible to achieve the via-filling without voids. The present invention also relates to a method for controlling the electrolytic copper plating solution by using an amount of a specific decomposition product of the sulfur-containing compound as an index.

13 Claims, No Drawings

ELECTROLYTIC COPPER PLATING SOLUTION AND METHOD FOR CONTROLLING THE SAME

BACKGROUND OF THE INVENTION

1. Field of the Invention

The present invention relates to an electrolytic copper plating solution containing a specific sulfur-containing compound and a thiol-reactive compound, and to an electrolytic copper plating process using such an electrolytic copper plating solution. The present invention also relates to a method for controlling the electrolytic copper plating solution by using an amount of a specific decomposition product of the sulfur-containing compound as an index.

2. Description of the Related Art

In recent years, high density and thin model printed wring boards have been strongly desired for making the size of electronic instruments such as personal computers small and enhancing the performance thereof. One of the techniques to comply with such a request is to use a multi-layer printed wiring board prepared by a build up method that performs a sequential lamination of forming a pattern on every layer (i.e., a build-up printed wiring board).

In late years, a via-filling method has been developed, where the whole micro via hole (MVH) is filled with a conductive material to electrically connect between adjacent layers of the build-up printed wiring board. In this method, an effective area of the printed wiring board can be increased. Further, in comparison with a plating only on the inner wall of the MVH by the conventional method, the via-filling method can provide a sufficient electric connection even when the MVH has a smaller diameter so that it is effective to obtain a small sized and high-density printed wiring board.

Several methods have been proposed as via-filling methods including a method of filling a conductive paste into the MVH using a printing process, a method of selectively stacking electroless copper plating by only activating a conductive layer of the bottom of the MVH, and a method using an electrolytic copper plating.

The conductive paste is a mixture of copper and organic compounds so that its electric conductivity is lower than that of a metal copper. Thus, it is difficult to obtain a sufficient electrical connection when the MVH having a small diameter is used. It means that it is not an effective method for fabricating a small-sized and high-density printed wiring board. Furthermore, the filling by printing process requires that a viscous paste is filled in a closed-end pore of a small diameter. In this case, however, it is difficult to fill the pore without remaining any space because of the viscosity of the paste. In addition, the method of using the electroless copper plating is superior than the method using the conductive paste in that the MVH filler is a high conductive metal copper deposit. However, the depositing rate of a plated film is substantially slow, so that there is a problem in its productivity. In the case of using a typical high-speed electroless copper plating bath, the depositing rate of the plated film may be almost 3 $\mu$m/hr. If the inside of a typical BVH (100 $\mu$m in diameter and 100 $\mu$m in depth) is to be filled by the high-speed electroless plating solution, its productivity is very unfavorable because it takes 30 hours or over for completing the plating.

In the case of the electrolytic copper plating, on the other hand, a depositing rate of the plated film is high (i.e., 10 to 50 $\mu$m/hr), so that the considerable reduction of processing time can be attained. Therefore, an application of electrolytic copper plating to the MVH has been expected. In the case of depositing the copper over the inside of the MVH, it is required to fill the inside of the MVH with the copper without remaining any space. For that purpose, the depositing rate at the vicinity of the bottom of the closed-end pore should be higher than the depositing rate at the opening thereof. If the depositing rate at the vicinity of the bottom is equal to or slower than the depositing rate at the opening, the MVH will not be filled up or the opening will be closed before completing the filling of the inside of the MVH with copper plating. Thus, some space is left in the inside of the pore. In any case, it has few practical applications.

Electrolytic copper plating baths containing a specific sulfur-containing compound have conventionally been used for the purpose of increasing the deposition rate in the vicinity of the bottom of MVHs. For this purpose, a direct-current electrolysis that makes use of a soluble anode, such as a phosphorus-containing copper anode, has generally been used as an electrolysis condition. While this approach can ensure a good MVH-filling property just after initial make-up of electroplating bath, the electrolytic copper plating bath becomes unstable over time and, after a certain length of time, the electrolytic copper plating layer forms aggregation, which affects the appearance of the plating and makes the via-filling property unstable. The causes for this phenomenon have yet to be theoretically understood and no effective approach for controlling the electrolytic copper plating solution that alleviates the instability of the plating solutions containing the above-described specific compound has been proposed thus far. Nor has there been proposed an electrolytic copper plating solution that has alleviated the problem of instability.

SUMMARY OF THE INVENTION

The present invention has been accomplished to address the above-described problems. Accordingly, it is an objective of the present invention to provide an electrolytic copper plating solution containing a specific sulfur-containing compound, which does not adversely affect the appearance of the plating and is suitable for forming filled vias. It is another objective of the present invention to provide an electrolytic copper plating process that makes use of the plating solution.

It is still another objective of the present invention to provide a method for controlling an electrolytic copper plating solution that does not adversely affect the appearance of the plating and is suitable for forming filled vias, the method comprising adding a thiol-reactive compound to the electrolytic copper plating solution containing a specific sulfur-containing compound in order to maintain the concentration of a certain decomposition product of the specific sulfur-containing compound that has a specific structure at a concentration lower than, or equal to, a predetermined concentration.

The present invention relates to an electrolytic copper plating solution containing a compound having the structure represented by the formula of —X—S—Y— wherein each of X and Y independently represents an atom selected from the group consisting of a hydrogen atom, a carbon atom, a sulfur atom, and a nitrogen atom, in which X and Y may represent the same only in the case of a carbon atom, and a thiol-reactive compound.

The present invention further relates to a process for an electrolytic copper plating using said electrolytic copper plating solution.

The present invention further relates to a method for controlling an electrolytic copper plating solution containing a compound having the structure represented by the formula of —X—S—Y— wherein each of X and Y independently represents an atom selected from the group consisting of a hydrogen atom, a carbon atom, a sulfur atom, and a nitrogen atom, in which X and Y may represent the same only in the case of a carbon atom, and a thiol-reactive compound, comprising adding a thiol-reactive compound and maintain the concentration of the compound having —X—S$^-$ structure equal or less than 1.0 micro mol/L.

DETAILED DESCRIPTION OF THE PREFERRED EMBODIMENTS

The electrolytic copper plating solution to be used in the present invention may be any bath solution that allows an electrolytic plating of copper, for example, a copper sulfate plating solution, a copper cyanide plating solution, and a copper pyrophosphate plating solution, but not limited thereto. Preferably, the electrolytic copper plating solution is a copper sulfate plating solution. In the following description, unless indicated otherwise, the copper sulfate plating solution will be used as a representative example of the electrolytic copper plating solution. By the way, the compositions, components, and the like of other plating solutions are within the confines of which one of ordinary skilled in the art will easily define from the published technical literature or the like in addition to the following description with respect to the copper sulfate plating solution.

The electrolytic copper plating solution of the present invention includes a compound having a structure represented by the formula of —X—S—Y—. In this formula, preferably, each of X and Y independently represents an atom selected from the group consisting of a hydrogen atom, a carbon atom, a nitrogen atom, a sulfur atom, and an oxygen atom. For the sake of simplicity, in the specification, the above compound is referred to as a sulfur-containing compound. More preferably, each of X and Y is an atom selected from the group of a hydrogen atom, a carbon atom, a nitrogen atom, and a sulfur atom. Further preferably, each of X and Y is an atom selected from the group of a hydrogen atom, a carbon atom, and a sulfur atom, in which X and Y may represent the same only in the case of a carbon atom.

By the way, in the above formula: —X—S—Y—, the atomic valence of S (i.e., sulfur) is 2. In this case, however, it does not mean that the atomic valence of each of X and Y is 2. Each of the X and Y atoms may be represented as one, which is able to combine with any atom in compliance with its atomic valence. For example, if X represents a hydrogen atom, then the above compound can be represented as H—S—Y—.

Preferably, the sulfur-containing compound is one having a sulfonic group or another group which is an alkali metal salt of sulfonic acid in its molecule. One or more sulfonic groups or alkali metal salts thereof may be present in the molecule.

More preferably, the sulfur-containing compound may be a compound having a structure represented as the formula of —S—CH$_2$O—R—SO$_3$M or —S—R—SO$_3$M, wherein M represents a hydrogen or alkali metal atom, and R represents an alkyl group having 3 to 8 carbon atoms. Still more preferably, the sulfur-containing compound may be selected from the compounds (1) to (8) listed below.

(1) M-SO$_3$—(CH$_2$)$_a$—S—(CH$_2$)$_b$—SO$_3$-M;
(2) M-SO$_3$—(CH$_2$)$_a$—O—CH$_2$—S—CH$_2$—O—(CH$_2$)$_b$—SO$_3$-M;
(3) M-SO$_3$—(CH$_2$)$_a$—S—S—(CH$_2$)$_b$—SO$_3$-M;
(4) M-SO$_3$—(CH$_2$)$_a$—O—CH$_2$—S—S—CH$_2$—O—(CH$_2$)$_b$—SO$_3$-M;
(5) M-SO$_3$—(CH$_2$)$_a$—S—C(=S)—S—(CH$_2$)$_b$—SO$_3$-M;
(6) M-SO$_3$—(CH$_2$)$_a$—O—CH$_2$—S—C(=S)—S—CH$_2$—O—(CH$_2$)$_b$—SO$_3$-M;
(7) X—S—(CH$_2$)$_a$—SO$_3$-M; and
(8) X—S—CH$_2$—O—(CH$_2$)$_a$—SO$_3$-M.

In the above formulas (1) to (8), each of a and b represents an integer in the range of 3 to 8, and M represents a hydrogen or an alkali metal element. X represents a hydrogen atom, an alkyl group having 1 to 10 carbon atoms an aryl group, a acyclic or cyclic amine compound consisting of 1 to 6 nitrogen atoms, 1 to 20 carbon atoms, and a plurality of hydrogen atoms, or a heterocyclic compound consisting of 1 to 2 sulfur atoms, 1 to 6 nitrogen atoms, 1 to 20 carbon atoms, and a plurality of hydrogen atoms.

The sulfur-containing compound may be typically used as a brightening agent. In the present invention, it is not limited to any particular application. It may be also used for another purpose without departing from the scope of the present invention. If the sulfur-containing compound is used, it may be formulated as a single compound or a mixture of two or more compounds.

If the sulfur-containing compound is provided as a brightening agent, it may be used in the amounts of 0.1 to 100 mg/L, preferably 0.5 to 10 mg/L. If the amount of the brightening agent in the plating solution is less than 0.1 mg/L, there is no effect for assisting the growth of a copper plated film. In addition, if it is over 100 mg/L, it is not preferable in terms of economy, because of no improvement in substantial effects commensurate therewith. In the case of using the sulfur-containing compound in another application except the brightening agent, those of ordinary skilled in the art will appreciate that the appropriate range of the usage amounts of the compound is easily modified as necessary.

The present inventors have found the following facts. That is, the increase in the amount of a compound of —X—S$^-$ or —Y—S$^-$, which is a cleavage product generated from the cleavage of a single bond of the above sulfur-containing compound: —X—S—Y—, leads to deterioration in the via-filling property in the process of electrolytic copper plating and in appearance of plated surface. In the above sulfur-containing compound, X and Y are replaceable. For example, in the case of the above brightening agent (1) M-SO$_3$—(CH$_2$)$_a$—S—(CH$_2$)$_b$—SO$_3$-M, the cleavage product to be generated may be M-SO$_3$—(CH$_2$)$_a$—S$^-$, or $^-$S—(CH$_2$)$_b$—SO$_3$-M, and alternatively one of them may be replaced with —X—S$^-$ or —Y—S$^-$. Hereinafter, as appropriate, the cleavage product of the sulfur-containing compound will be represented as "—X—S$^-$". A compound —X—S$^-$ contained in the electrolytic copper plating solution may be a compound in which a single bond of X—S or S—Y is only cleaved and the other parts are remained as they are in a sulfur-containing compound —X—S—Y—. Alternatively, the cleavage product may be a compound that keeps a "X—S$^-$" structure in spite of the cleavage in a portion connected to X, or it may be a mixture of a plurality of different cleavage products.

The concentration of the compound having the "—X—S$^-$" structure (i.e., the amount of a cleavage product of the sulfur-containing compound) can be estimated by any well-known method, but not limited to, such as one using a high speed liquid chromatography. In the case of the measurement using the high speed liquid chromatography, an aliquot of the plating solution may be directly used as a sample of such a chromatography, or after removing any contaminant from the plating solution so as to avoid a noise to be caused by the contaminant.

If the —X—S⁻ compound is of a single species, the concentration of such a single compound corresponds to the amount of the compound having the "—X—S⁻" structure. If the —X—S⁻ compound is of a mixture of several species, the total amount of the compounds in the mixture corresponds to the amount of the compound having the "—X—S⁻" structure.

In the electrolytic copper plating solution, furthermore, the —X—S⁻ compound is typically paired with a cation such as a metal ion or a hydrogen ion. Therefore, the —X—S⁻ compounds may include any compound having the structure of —X—S—H, except in the specific case such as for considering a chemical or physical action of the —X—S⁻ compound.

Though it is not preferable to be bound by theory, a primary mechanism of generating a compound having the structure of —X—S⁻ in the electrolytic copper plating solution may be thought as follows. If a soluble anode such as one composed of a phosphorus-containing copper material is used in the electrolyte process, the soluble anode is reacted with the sulfur-containing compound during the period of suspending the electrolytic process. Such a reaction allows the cleavage of a single bond of S—X or S—Y in the sulfur-containing compound, resulting in the generation of a compound having the structure of —X—S⁻. During the period of progressing the electrolytic process, the above sulfur-containing compound receives electrons at the cathode, causing the cleavage of a single bond of S—X or S—Y in the sulfur-containing compound to generate a compound having the structure of —X—S⁻. At the anode, on the other hand, the sulfur-containing compound receives electrons released at the time of converting from Cu to $Cu^{2+}$ from the soluble anode, so that the sulfur-containing compound becomes one having the structure of —X—S⁻.

Furthermore, a mechanism in which a compound having the structure of —X—S⁻ can have a detrimental effect on the electrolytic copper plating may be thought as follows. The above compound makes an ionic bond with a metal ion such as $Cu^+$ or $Cu^{2+}$. The presence of such a coupled compound causes the formation of particles as the metal is deposited, so that a metal layer of inferior qualities with respect to adherence, heat resistance, and so on. In addition, it is also conceivable that the resulting metal layer could be of deterioration in appearance of plated surface (e.g., a poor gloss finish). Regarding the formation of a filled via, furthermore, the coupled compound composed of the cleavage product and the metal ion makes an insufficient via-filling as the depositing rate of the metal in the vicinity of the bottom of the via hole is equal to or lower than that of the metal in the opening of the via hole. In addition, it is also conceivable that a gap could be untouched in spite of terminating the filling process depending on the shape or the like of the via hole.

In the method for controlling the electrolytic copper plating solution of the present invention, the concentration of the compound having the structure of —X—S⁻, which is an index to be controlled, may be preferably 2.0 micro mol/L or less in terms of without frosting a plated surface, or preferably 1.0 micro mol/L or less in terms of keeping an excellent gloss finish of a plated surface, more preferably 0.5 micro mol/L or less.

For obtaining a good via-filling property, furthermore, it is preferable to keep the concentration of the compound having the structure of —X—S⁻ at 0.15 μmol/L or less, more preferably 0.1 μmol/L or less.

The electrolytic copper plating solution of the present invention contains a thiol-reactive compound. The term "thiol-reactive compound" as used herein refers to any compound that reacts with a compound that has a structure expressed as —X—S⁻ and is present in the electrolytic copper plating solution to form a compound with a structure expressed as —X'—S—Y'—, wherein X' and Y' are each independently an atom selected from the group consisting of carbon, nitrogen, sulfur, and oxygen. The compound having the —X'—S—Y'— structure may or may not be identical to the compound having the —X—S—Y— structure, which is initially added to the electrolytic copper plating solution.

Preferably, the thiol-reactive compound is at least one selected from the group consisting of carboxylic acid, peroxo acid, aldehyde and ketone of aliphatic compounds, alicyclic compounds, aromatic compounds or heterocyclic compounds and hydrogen peroxide. More preferably, the thiol-reactive compound is at least one selected from the group consisting of carboxylic acid, peroxo acid, aldehyde and ketone of aliphatic compounds or alicyclic compounds and hydrogen peroxide. Still more preferably, the thiol-reactive compound is at least one selected from the group consisting of carboxylic acid, peroxo acid, aldehyde and ketone of aliphatic compounds or alicyclic compounds and hydrogen peroxide, where the compound has 1 to 6 carbon atoms when it is an aliphatic compound or has 3 to 7 carbon atoms when it is an alicyclic compound. The term "aliphatic" as used herein refers to any aliphatic compound that is either substituted or unsubstituted with any substituents, either saturated or unsaturated, or either straight-chained or branched. The term "alicyclic compounds, aromatic or heterocyclic compounds" as used herein refers to any of the above-mentioned compounds that is either substituted or unsubstituted with any substituents.

Examples of preferred carboxylic acid for use as the thiol-reactive compound of the present invention include formic acid, propionic acid, butyric acid, isobutyric acid, valeric acid, isovaleric acid, oxalic acid, malonic acid, succinic acid, glutaric acid, adipic acid, acrylic acid, methacrylic acid, crotonic acid, maleic acid, fumaric acid, citraconic acid and mesaconic acid. Of these, formic acid is particularly preferred. Examples of preferred peroxo acid include performic acid, peracetic acid, peroxypropionic acid, peroxybutanoic acid and peroxypentanoic acid. Examples of preferred aldehyde include formaldehyde, glutaraldehyde, acetaldehyde, propionaldehyde, acrylaldehyde, butyraldehyde, valeraldehyde, malonaldehyde, succinaldehyde and glyoxal. Of these, formaldehyde and glutaraldehyde are particularly preferred. Examples of preferred ketone include acetone, methylethylketone and diethylketone.

Without wishing to be bound by theory, it is believed that, when the thiol-reactive compound is carboxylic acid, peroxo acid, aldehyde, or hydrogen peroxide, it oxidizes the compound with the —X—S⁻ structure, which is produced in the electrolytic copper plating solution, to form the —X'—S—S—Y'— structure (where X' and Y' are each independently an atom selected from the group consisting of carbon, nitrogen, sulfur and oxygen), such that the amount of the compound having the —X—S⁻ structure is decreased. It is also believed that, when the thiol-reactive compound is aldehyde or ketone, it reacts with the compound with the —X—S⁻ structure produced in the electrolytic copper plating solution to form thioacetal or ketonethioacetal, decreasing the amount of the —X—S⁻ compound. It should be appreciated, however, that the mechanism by which the thiol-reactive compound of the present invention acts to reduce the amount of the compound with the —X—S⁻ structure is not limited to the reactions described above but includes any reaction that leads to a decrease in the amount of the compound with the —X—S⁻ structure.

The amount of the thiol-reactive compound to be added to the electrolytic copper plating solution in the present invention is properly determined depending upon its purposes, such as to improve the appearance of the plating and to improve the via-filling property, the amount and the type of the sulfur-containing compound to be added to the electrolytic copper plating solution, as well as the conditions for the electrolytic copper plating, such as the type of the electrode used and how the current is applied. In general, the thiol-reactive compound is added to the electrolytic copper plating solution to a concentration of $1.0 \times 10^{-4}$ to $1.0 \times 10^{-1}$ mol/L, preferably $1.0 \times 10^{-4}$ to $1.0 \times 10^{-2}$ mol/L.

In the present invention, the thiol-reactive compound may be added to the electrolytic copper plating solution at any time point, for example, during preparation of the electrolytic copper plating solution bath, or during or after the electrolytic copper plating process: the thiol-reactive compound may be added when the level of compound having the —X—S⁻ structure in the plating solution, which has been put under monitoring, exceeds a predetermined level, or it may be added when the plating solution ceases exhibiting the desired plating performance.

The thiol-reactive compound may be added to the electrolytic copper plating solution as it is, or it may be dissolved in water for addition, or it may be added as a mixture with other additives. When the thiol-reactive compound is carboxylic acid or peroxo acid, it can be added to the electrolytic copper plating solution in the form of carboxylic acid or peroxo acid, or in the form of salt formed with an alkaline compound, or in the form of anhydride.

A basic composition of the electrolytic copper plating solution of the present invention may be a well-known composition to be used in a typical electrolytic copper plating, without no particular limitation. For only attaining the object of the present invention, it is possible to make a change to the components of the principal composition, the concentration of each component, the amount of additives, and so on as necessary. In the case of copper sulfate plating, for example, the copper sulfate plating solution has a principle composition including sulfuric acid, copper sulfate, and water-soluble chlorine compound. The principle composition of such a plating solution is not limited to any particular solution if it is used for the well-known copper sulfate plating.

The concentration of sulfuric acid in the copper sulfate plating solution is typically in the range of 30 to 400 g/L, preferably 170 to 210 g/L. For example, if the concentration of the sulfuric acid is less than 30 g/L, the conductivity of the plating bath decreases. In this case, therefore, it is difficult to pass a current through the plating bath. If the concentration of sulfuric acid is greater than 400 g/L, it is hard to dissolve the copper sulfate in the plating bath. Thus, the copper sulfate becomes precipitated.

The concentration of copper sulfate in the copper sulfate plating solution is typically in the range of 20 to 250 g/L, preferably 60 to 180 g/liter. For example, if the concentration of copper sulfate is less than 20 g/L, the supply of copper ions to a substrate (a target of the plating) becomes insufficient. In this case, therefore, it becomes difficult to deposit a normal plated film. In addition, it is difficult to dissolve over 250 g/L of copper sulfate in the copper sulfate plating solution.

As the water-soluble chlorine compound contained in the copper sulfate plating solution to be applied in the present invention may be a well-known composition to be used in a typical copper sulfate plating, without no particular limitation. The water-soluble chlorine compound may includes, but not limited to, hydrochloric acid, sodium chloride, potassium chloride, and ammonium chloride. The water-soluble chlorine compound may be composed of a single species of such a compound, or alternatively may be composed of two or more species.

The concentration of the water-soluble chlorine compound contained in the copper sulfate plating solution of the present invention is typically in the range of 10 to 200 mg/L, preferably 30 to 80 mg/L, as a chlorine ion concentration. If the concentration of chlorine ions is less than 10 mg/L, a brightening agent, a surfactant, or the like becomes difficult to act normally. If it is greater than 200 mg/L, the amount of chlorine gas from the anode increases. Thus, it is not preferable.

The electrolytic copper plating solution to be used in the present invention may optionally contain a surfactant. The surfactant may be any one of well known surfactants to be generally used as an additive of the electrolytic copper plating solution. Preferable surfactants may be selected from the compounds represented by the following formulas (9) to (13), but not limited to these compounds.

(9) HO—(CH₂—CH₂—O)ₐ—H (wherein "a" represents one of integral numbers of 5 to 500);

(10) HO—(CH₂—CH(CH₃)—O)ₐ—H (wherein "a" represents one of integral numbers of 5 to 200);

(11) HO—(CH₂—CH₂—O)ₐ—(CH₂—CH(CH₃)—O)ᵦ—(CH₂—CH₂—O)꜀—H (wherein each of "a" and "c" is one of integral numbers that satisfy a+c=5 to 200, and "b" represents one of integral numbers of 1 to 100);

(12) —(NH₂CH₂CH₂)n-(wherein n=5 to 500);

(13)

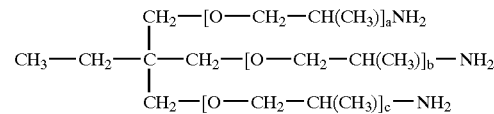

(wherein each of "a", "b", and "c" represents an integral number).

The surfactant to be used in the present invention may be used solely, or used as a mixture of two or more species of surfactants. The surfactant to be used in the present invention may be, for example, in the range of 0.05 to 10 g/L, preferably 0.1 to 5 g/L. If the concentration of the surfactant in the plating solution is less than 0.05 g/L, many pin holes are formed on the plated film because of insufficient wet abilities. As a result, it becomes difficult to deposit a normal plated film. In addition, even more than 10 g/L of the surfactant, it can hardly get the improvement on effects commensurate therewith. Thus, it is not preferable in terms of economy.

A substrate to be processed by the process of electrolytic copper plating according to the present invention may be of one made of any substance and shape if it is able to stand the conditions of the present invention and may be of allowing the formation of a metal layer thereon by plating. The raw material of the substrate may be selected from, but not limited to, resins, ceramics, metals, and so on. For instance, but not limited to, the substrate made of a resin is a printed wiring board, one made of a ceramic is a semiconductor wafer. A metal may be silicon or the like but not limited to. For instance, but not limited to, a silicon wafer may be exemplified as a substrate consisting of a metal. Especially, the method of the present invention is excellent to fill the via hole, so that an appropriate substrate to be applied in the present invention may be preferably of having a through hole, a via hole, or the like. More preferably, it may be a printed wiring board or wafer having a through hole and/or a via hole.

The resins to be used for the substrate, for example, include: thermoplastic resins such as polyolefin resins such as polyethylene including high density polyethylene, middle density polyethylene, branched low density polyethylene, linear low density polyethylene, and super-high molecular weight polyethylene, polypropylene resin, polybutadiene, polybutylene resin, polystyrene resin; halogen-containing resin such as polyvinyl chloride resin, polyvinylidenechloride resin, polyvinylidene chloride-vinyl chloride copolymer resin, chlorinated polyethylene, chlorinated polypropylene, and tetrafluoroethylene; acrylonitrile-styrene (AS) resin; ABS resin; MBS resin; polyvinyl alcohol resin; polyacrylic ester resin such as methyl polyacrylate; polymethacrylate ester resin such as methyl polymethacrylate; methyl methacrylate-styrene copolymer resin; maleic anhydride-styrene copolymer resin; polyvinyl acetate resin; cellulosic resins such as propionic acid cellulose and cellulose acetate resin; epoxy resin; polyimide resin; polyamide resin such as nylon; polyamide imido resin; polyallylate resin; polyether imide resin; polyether etherketone resin; polyethylene oxide resin; various kinds of polyester resins such as PET resin; polycarbonate resin; polysulfon resin; polyvinyl ether resin; polyvinyl butyral resin; polyphenylene ether resin such as polyphenylene oxide; polyphenylene sulfide resin; polybutylene terephthalate resin; polymethyl pentene resin; polyacetal resin; vinyl chloride-vinyl acetate copolymer; ethylene-vinyl acetate copolymer; ethylene-vinyl chloride copolymer; and copolymers and blends thereof. Further, the resins to be used for the substrate, for example, include thermosetting resins such as epoxy resin; xylene resin; guanamine resin; diallyl phthalate resin, vinyl ester resin; phenol resin; unsaturated polyester resin; furan resin; polyimide resin; polyurethane resin; maleic resin; melamine resin; urea resin; and mixtures thereof, but not limited to. The preferable resins may include epoxy resin, polyimide resin, vinyl resin, phenol resin, nylon resin, polyphenylene ether resin, polypropylene resin, fluorine-based resin, and ABS resin. More preferable resins include epoxy resin, polyimide resin, polyphenylene ether resin, fluorine-based resin, and ABS resin. Still more preferable resins include epoxy resin and polyamide resin. Furthermore, the resin substrate may be of a single resin or may be composed of two or more resins. Alternatively, it may be provided as a complex in which the resin is applied or stacked on another substrate. Furthermore, the resin substrate to be available in the present invention is not limited to a molded resin material. It may be provided as a complex in which a reinforcing material such as a glass fiber strengthening material between the resins, or a complex in which a resin film is coated on a substrate made of various raw materials such as ceramic, glass, and metal such as silicon.

Ceramics to be used as raw materials of the substrate include oxide ceramics such as almina ($Al_2O_3$), steatite ($MgO.SiO_2$), forsterite ($2MgO.SiO_2$), mullite ($3Al_2O_3.2SiO_2$), magnesium oxide (MgO), spinel ($MgO.Al_2O_3$), and beryllia (BeO); non-oxide ceramics such as aluminum nitride and silicon carbide; low temperature baking ceramics such as glass ceramics; and so on, but not limited to.

The substrate to be processed by the process of the present invention is subjected to the process of providing the substrate with an electric conductivity prior to the electrolytic copper plating. For instance, in the case of filling the MVH with metal copper by the method of electrolytic copper plating of the present invention using the electrolytic copper plating solution. The inside of the MVH becomes conductive at first. Such a process of providing the conductivity may be performed using any one of well known methods of providing conductivities, but not limited to, such as non-electrolytic copper plating, direct plating, conductive particle absorbing treatment, and vapor plating.

In the method of electrolytic copper plating in accordance with the present invention, the temperature of plating process (i.e., the temperature of plating solution) may be adjusted as necessary depending on the type of a plating bath. In general, such a temperature may be in the range of 10 to 40° C., preferably 20 to 30° C. If the plating temperature is less than 10° C., the conductivity of the plating solution decreases. In this case, therefore, the current density at the time of electrolytic process cannot be increased, so that the growing rate of the plated film decreases, resulting in the decrease in the productivity.

Furthermore, if the plating temperature is greater than 40° C., the decomposition of the brightening agent could be occurred. Thus, it is not preferable.

Any type of electric current may be used in the electrolytic copper plating of the present invention including direct current and pulse periodic reverse current (PPR). The anodic current density can properly be determined depending upon the type of the plating bath and is typically in the range of 0.1 to 10 $A/dm^2$, preferably in the range of 1 to 3 $A/dm^2$. When the anodic current density is less than 0.1 $A/dm^2$, the area of the anode becomes excessively large, which is economically unfavorable. Conversely, when the anodic current density is greater than 10 $A/dm^2$, oxygen is generated at the anode upon electrolysis, facilitating the oxidative degradation of the brightening agent.

Any type of electrode, such as soluble anodes or insoluble anodes, may be used in the electrolytic copper plating process of the present invention. Examples of the soluble anode include, but are not limited to, phosphorus-containing copper anodes, while examples of the insoluble anode include, but are not limited to, anodes made of materials including iridium oxide, titanium coated with platinum, platinum, graphite, ferrite, lead dioxide, and titanium or stainless steel coated with an oxide of any element of the platinum group.

In the plating process of the present invention, it is preferred to increase the concentration of dissolved oxygen in the plating solution by passing air or oxygen through the plating solution. Without wishing to be bound by theory, it is believed that the dissolved oxygen in the plating solution serves as an oxidizing agent to decrease the amount of the compound with the —X—S$^-$ structure in the plating solution. One preferred way to increase the concentration of the dissolved oxygen in the plating solution is to pass bubbles of air or oxygen through the plating solution. This may be done by stirring the plating solution or by other bubbling techniques that do not involve stirring. This bubbling process to increase the concentration of dissolved oxygen in the plating solution may be preformed during the electro plating process or during an interval of the electro plating process.

The process of electrolytic copper plating in accordance with the present invention, stirring may be performed without any trouble. It is preferable to perform stirring for uniformly supplying copper ions and an additive on the surface of the plating target. As a stirring method, an air stirring or jet flow stirring method may be used. It is preferable to perform the stirring with air in terms of increasing the amount of dissolved oxygen in the plating solution. In addition, if the stirring is performed by means of jet flow, stirring with air may be used together. Furthermore, a replacing or circulating filtration may be performed. In particular, it is preferable to perform a circulating filtration of the plating solution using a filter to make the temperature of the plating solution uniform. In addition, debris, precipitate, or the like can be removed from the plating solution by such a filtration.

The electrolytic copper plating process of the present invention provides a composite material that includes a copper layer formed on a substrate. The use of the electrolytic copper plating solution of the present invention in electrolytic copper plating can prevent the copper layer on the resulting composite material from forming aggregation and, when the plating is intended to fill vias, make it possible to achieve the via-filling without voids.

The present invention is now described in detail in reference to Examples, which are not intended to limit the scope of the invention in any way.

EXAMPLES

Example 1

The Effects of MPS on the Appearance of the Plating

The following ingredients are dissolved in distilled water to form an electrolytic copper plating solution: 200 g/L copper sulfate-$5H_2O$; 100 g/L sulfuric acid; 50 mg/L chlorine; 1.5 mL/L disodium bis(3-sulfopropyl)disulfide (SPS) solution (1 g/L); and 1.5 mL/L surfactant solution (125 mL/L). A sodium salt of 3-mercapto-1-propanesulfonic acid (MPS, available from Tokyo Kasei, Co., Ltd.) was added to the electrolytic copper plating solution to a concentration of 10 to 100 µg/L (0.056 to 5.6 µmol/L). The resulting solution was used to perform the electrolytic copper plating process (bath volume 1.5 L, temperature of the plating bath 23° C., current density 2ASD, phosphorus-containing copper soluble anode used) to form a 20 µm thick deposit on a substrate. As the substrate, a test substrate having micro via holes with a diameter of 100 µm and a depth of 80 µm was used. Steps involved in the process, which starts with the pretreatment of the substrate and ends with the drying, are shown in Table 1.

TABLE 1

| Steps in the plating process | | |
|---|---|---|
| Treatment | Temperature | Time |
| Dip in methanol | Room temperature | 30 sec |
| Rinse with water | 45° C. | 3 min |
| Degrease with alkaline solution | Room temperature | 1 min |
| Rinse with water | 23° C. | 1 min |
| Soft etch | Room temperature | 1 min |
| Rinse with water | 23° C. | 1 min |
| 10% sulfuric acid | Room temperature | 1 min |
| Electrolytic copper plating | 23° C. | 50 min |
| Rinse with water | Room temperature | 1 min |
| Rustproof treatment | 23° C. | 30 sec |
| Rinse with water | Room temperature | 1 min |
| Drying | | |

After the electrolytic copper plating process had been completed, the appearance of the plating was visually observed and a comparison was made with a standard plate for rating. The results are shown in Table 2.

TABLE 2

| MPS conc. (µg/L) | 10 | 100 | 200 | 300 | 500 | 1000 |
|---|---|---|---|---|---|---|
| Appearance | glossy | glossy | Semi-glossy | Semi-glossy | Matte | Matte |

The correlation between the MPS concentration and the appearance of the plating was examined. Decreased gloss was observed at concentrations of 200 µg/L or higher. The appearance became matte at concentrations of 500 µg/L or higher. These results imply that good appearance of the plating can be maintained by controlling the concentration of the MPS at a certain value or lower.

Example 2

The Effects of the MPS on the Via-Filling Property

Electrolytic copper plating was performed using the same conditions as in Example 1 except that the MPS concentration was in the range of 0 to 100 µg/L (0 to 0.56 µmol/L). Subsequently, the metal deposition formed in the vias was examined.

In vias plated using different concentrations of MPS the covering power became low as the amount of MPS was increased. The via-filling property became low as the amount of MPS was increased and with the MPS concentration of 25 µg/L or higher, the via-filling property became insufficient.

Example 3

Improvement in the Via-Filling Property through the Use of Formaldehyde

Electrolytic copper plating was performed using the same conditions as in Example 2 except that the MPS concentration was 50 or 100 µg/L, and 72 mg/L formaldehyde was added. Subsequently, the metal deposition formed in the vias was examined.

Vias plated using Different concentrations of MPS, to which Formaldehyde had been added, exhibited a substantially perfect via-filling property at both MPS concentrations of 50 µg/L and 100 µg/L, though the via-filling property at 100 µg/L was slightly lower than that at 50 µg/L. In comparison, as described above, the via-filling property was insufficient at the MPS concentrations of 50 µg/L and 100 µg/L in Example 2, which was formaldehyde-free. These results suggest that formaldehyde has an ability to compensate for the reduction in the via-filling property of the electrolytic copper plating solution, which is imparted by MPS. Accordingly, it has been proven that the electrolytic copper plating solution can be controlled through addition of formaldehyde.

As has been described thus far, the present invention, taking advantage of an electrolytic copper plating solution containing a sulfur-containing compound along with a thiol-reactive compound, is advantageous in that the concentration of a compound with the —X—S⁻ structure, which is a decomposition product of the sulfur-containing compound, can be decreased, thereby eliminating the problem of deterioration of the plating appearance, and in that the via-filling property does not decrease. Further, the present invention makes it possible, by providing a simple method involving addition of the thiol-reactive compound, to control the concentration of the compound having the —X—S⁻ structure present in the electrolytic copper plating solution containing the sulfur-containing compound. As a consequence, it is made easier than ever before to control the electrolytic copper plating solution in a manner that neither affects the appearance of the plating nor decreases the via-filling property.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An electrolytic copper plating solution suitable for filling vias in a substrate with copper, the solution comprising copper, water, a water-soluble chlorine compound, a brightening agent compound having the structure represented by the formula of —X—S—Y—
   wherein each of X and Y independently represents an atom selected from the group consisting of a hydrogen atom, a carbon atom, a sulfur atom, and a nitrogen atom, in which X and Y may represent the same only in the case of a carbon atom, and
   a thiol-reactive compound chosen from performic acid, peracetic acid, peroxypronionic acid, peroxybutanoic acid or peroxypentanoic acid.

2. The electrolytic copper plating solution according to claim 1, wherein the compound having the structure represented by the formula of —X—S—Y—
   wherein each of X and Y independently represents an atom selected from the group consisting of a hydrogen atom, a carbon atom, a sulfur atom, and a nitrogen atom, in which X and Y may represent the same only in the case of a carbon atom, is selected from the group consisting of:
   (1) M-SO$_3$—(CH$_2$)$_a$—S—(CH$_2$)$_b$—SO$_3$-M;
   (2) M-SO$_3$—(CH$_2$)$_a$—O—CH$_2$—S—CH$_2$—O—(CH$_2$)$_b$—SO$_3$-M;
   (3) M-SO$_3$—(CH$_2$)$_a$—S—S—(CH$_2$)$_b$—SO$_3$-M;
   (4) M-SO$_3$—(CH$_2$)$_a$—O—CH$_2$—S—S—CH$_2$—O—(CH$_2$)$_b$—SO$_3$-M;
   (5) M-SO$_3$—(CH$_2$)$_a$—S—C(=S)—S—(CH$_2$)$_b$—SO$_3$-M;
   (6) M-SO$_3$—(CH$_2$)$_a$—O—CH$_2$—S—C(=S)—S—CH$_2$—O—(CH$_2$)$_b$—SO$_3$-M;
   (7) A-S—(CH$_2$)$_a$—SO$_3$-M; and
   (8) A-S—CH$_2$—O—(CH$_2$)$_a$—SO$_3$-M
   wherein each of a and b represents an integer in the range of 3 to 8; M represents a hydrogen or alkali metal element; and A represents: a hydrogen atom; an alkyl group having 1 to 10 carbon atoms; an aryl group; an acyclic or cyclic amine compound containing 1 to 6 nitrogen atoms, 1 to 20 carbon atoms, and a plurality of hydrogen atoms; or a heterocyclic compound containing 1 to 2 sulfur atoms, 1 to 6 nitrogen atoms, 1 to 20 carbon atoms, and a plurality of hydrogen atoms.

3. The electrolytic copper plating solution according to claim 1, wherein the electrolytic copper plating solution contains 0.1 to 100 mg/L of the compound having the structure represented by the formula of —X—S—Y—.

4. The electrolytic copper plating solution according to claim 1, wherein the thiol-reactive compound is present in the electrolytic copper plating solution in an amount from $1.0 \times 10^{-4}$ to $1.0 \times 10^{-1}$ mol/L.

5. The electrolytic copper plating solution according to claim 1, wherein the copper comprises copper sulfate, copper cyanide or copper pyrophosphate.

6. A process for filling vias in a substrate by electrolytic copper plating comprising contacting the substrate with an electrolytic copper plating solution comprising copper, water, a water-soluble chlorine compound, a brightening agent compound having the structure represented by the formula of —X—S—Y—
   wherein each of X and Y independently represents an atom selected from the group consisting of a hydrogen atom, a carbon atom, a sulfur atom, and a nitrogen atom, in which X and Y may represent the same only in the case of a carbon atom, and
   a thiol-reactive compound chosen from peroxo acids, aliphatic aldehyde compounds, alicyclic aldehyde compounds, aliphatic ketone compounds, alicyclic ketone compounds, hydrogen peroxide or carboxylic acids; wherein the carboxylic acids are chosen from formic acid, propionic acid, butyric acid, isobutyric acid, valeric acid, isovaleric acid, oxalic acid, malonic acid, succinic acid, glutaric acid, adipic acid, acrylic acid, methacrylic acid, crotonic acid, maleic acid, fumaric acid, citraconic acid or mesaconic acid, and applying an anodic current density of 0.1 to 10 A/dm$^2$ and maintaining a concentration of a compound having —X—S⁻ structure equal or less than 2.0 micro mol/L.

7. The process of claim 6, wherein the substrate is a printed wiring board or a wafer.

8. The process according to claim 6, wherein the peroxo acids are chosen from performic acid, peracetic acid, peroxypropionic acid, peroxybutanoic acid or peroxypentanoic acid.

9. The process according to claim 6, wherein the copper comprises copper sulfate, copper cyanide or copper pyrophosphate.

10. The process of claim 6 wherein the vias are filled without voids.

11. A method for filling vias in a substrate with copper by electrolytic copper plating comprising contacting the substrate with an electrolytic copper plating solution comprising copper, water, a water-soluble chlorine compound, a brightening agent compound having the structure represented by the formula of —X—S—Y—
   wherein each of X and Y independently represents an atom selected from the group consisting of a hydrogen atom, a carbon atom, a sulfur atom, and a nitrogen atom, in which X and Y may represent the same only in the case of a carbon atom, and
   a thiol-reactive compound chosen from peroxo acids, aliphatic aldehyde compounds, alicyclic aldehyde compounds, aliphatic ketone compounds, alicyclic ketone compounds, hydrogen peroxide or carboxylic acids; wherein the carboxylic acids are chosen from formic acid, propionic acid, butyric acid, isobutyric acid, valeric acid, isovaleric acid, oxalic acid, malonic acid, succinic acid, glutaric acid, adipic acid, acrylic acid, methacrylic acid, crotonic acid, maleic acid, fumaric acid, citraconic acid or mesaconic acid,
   and maintaining a concentration of a compound having —X—S⁻ structure equal or less than 1.0 micro mol/L and applying an anodic current density of 0.1 to 10 A/dm$^2$.

12. The method according to claim 11, wherein the compound having the structure represented by the formula of —X—S—Y— wherein each of X and Y independently represents an atom selected from the group consisting of a hydrogen atom, a carbon atom, a sulfur atom, and a nitrogen atom, in which X and Y may represent the same only in the case of a carbon atom, is selected from the group consisting of:

(1) $M\text{-}SO_3\text{—}(CH_2)_a\text{—}S\text{—}(CH_2)_b\text{—}SO_3\text{-}M$;
(2) $M\text{-}SO_3\text{—}(CH_2)_a\text{—}O\text{—}CH_2\text{—}S\text{—}CH_2\text{—}O\text{—}(CH_2)_b\text{—}SO_3\text{-}M$;
(3) $M\text{-}SO_3\text{—}(CH_2)_a\text{—}S\text{—}S\text{—}(CH_2)_b\text{—}SO_3\text{-}M$;
(4) $M\text{-}SO_3\text{—}(CH_2)_a\text{—}O\text{—}CH_2\text{—}S\text{—}S\text{—}CH_2\text{—}O\text{—}(CH_2)_b\text{—}SO_3\text{-}M$;
(5) $M\text{-}SO_3\text{—}(CH_2)_a\text{—}S\text{—}C(=S)\text{—}S\text{—}(CH_2)_b\text{—}SO_3\text{-}M$;
(6) $M\text{-}SO_3\text{—}(CH_2)_a\text{—}O\text{—}CH_2\text{—}S\text{—}C(=S)\text{—}S\text{—}CH_2\text{—}O\text{—}(CH_2)_b\text{—}SO_3\text{-}M$;
(7) $A\text{-}S\text{—}(CH_2)_a\text{—}SO_3\text{-}M$; and
(8) $A\text{-}S\text{—}CH_2\text{—}O\text{—}(CH_2)_a\text{—}SO_3\text{-}M$ wherein each of a and b represents an integer in the range of 3 to 8; M represents a hydrogen or alkali metal element; A represents: a hydrogen atom; an alkyl group having 1 to 10 carbon atoms; an aryl group; an acyclic or cyclic amine compound containing 1 to 6 nitrogen atoms, 1 to 20 carbon atoms, and a plurality of hydrogen atoms; or a heterocyclic compound containing 1 to 2 sulfur atoms, 1 to 6 nitrogen atoms, 1 to 20 carbon atoms, and a plurality of hydrogen atoms.

13. The method according to claim 11, wherein the aliphatic aldehyde compounds are chosen from formaldehyde, glutaraldehyde, acetaldehyde, proprionaldehyde, malonaldehyde, succinaldehyde, or glyoxal.

* * * * *